United States Patent
Ito et al.

(10) Patent No.: US 8,829,461 B2
(45) Date of Patent: Sep. 9, 2014

(54) SCANNING APPARATUS, DRAWING APPARATUS, AND METHOD OF MANUFACTURING ARTICLE

(71) Applicant: Canon Kabushiki Kaisha, Tokyo (JP)

(72) Inventors: Hirohito Ito, Utsunomiya (JP); Yusuke Sugiyama, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/668,619

(22) Filed: Nov. 5, 2012

(65) Prior Publication Data

US 2013/0137044 A1    May 30, 2013

(30) Foreign Application Priority Data

Nov. 25, 2011   (JP) ................................ 2011-258217

(51) Int. Cl.
*G21K 5/04* (2006.01)
(52) U.S. Cl.
USPC .................... 250/396 R; 250/397; 250/492.1; 250/492.3
(58) Field of Classification Search
USPC .......... 430/296; 250/306, 307, 309, 310, 311, 250/396 R, 397, 398, 492.1, 492.2, 492.21, 250/492.22, 492.3
See application file for complete search history.

(56) References Cited

U.S. PATENT DOCUMENTS

| 6,777,698 B2* | 8/2004 | Ito ............................ 250/492.23 |
| 2005/0088099 A1 | 4/2005 | Ota et al. |
| 2008/0315095 A1* | 12/2008 | Nakasuji et al. .............. 250/310 |

FOREIGN PATENT DOCUMENTS

| JP | 4074240 B | 4/2008 |
| WO | 2010134018 A2 | 11/2010 |

* cited by examiner

*Primary Examiner* — Nicole Ippolito
(74) *Attorney, Agent, or Firm* — Rossi, Kimms & McDowell LLP

(57) ABSTRACT

A scanning apparatus which performs scan on an object with a charged particle beam includes: a blanking deflector configured to individually blank a plurality of charged particle beams based on control data; a scanning deflector configured to collectively deflect the plurality of charged particle beams to perform the scan; and a controller. The controller is configured to hold first data used to obtain error in a scanning amount and a scanning direction of the scanning deflector relative to a reference scanning amount and a reference scanning direction with respect to each of the plurality of charged particle beams, and to generate the control data based on the first data so that the scan is performed for a target region on the object.

13 Claims, 11 Drawing Sheets

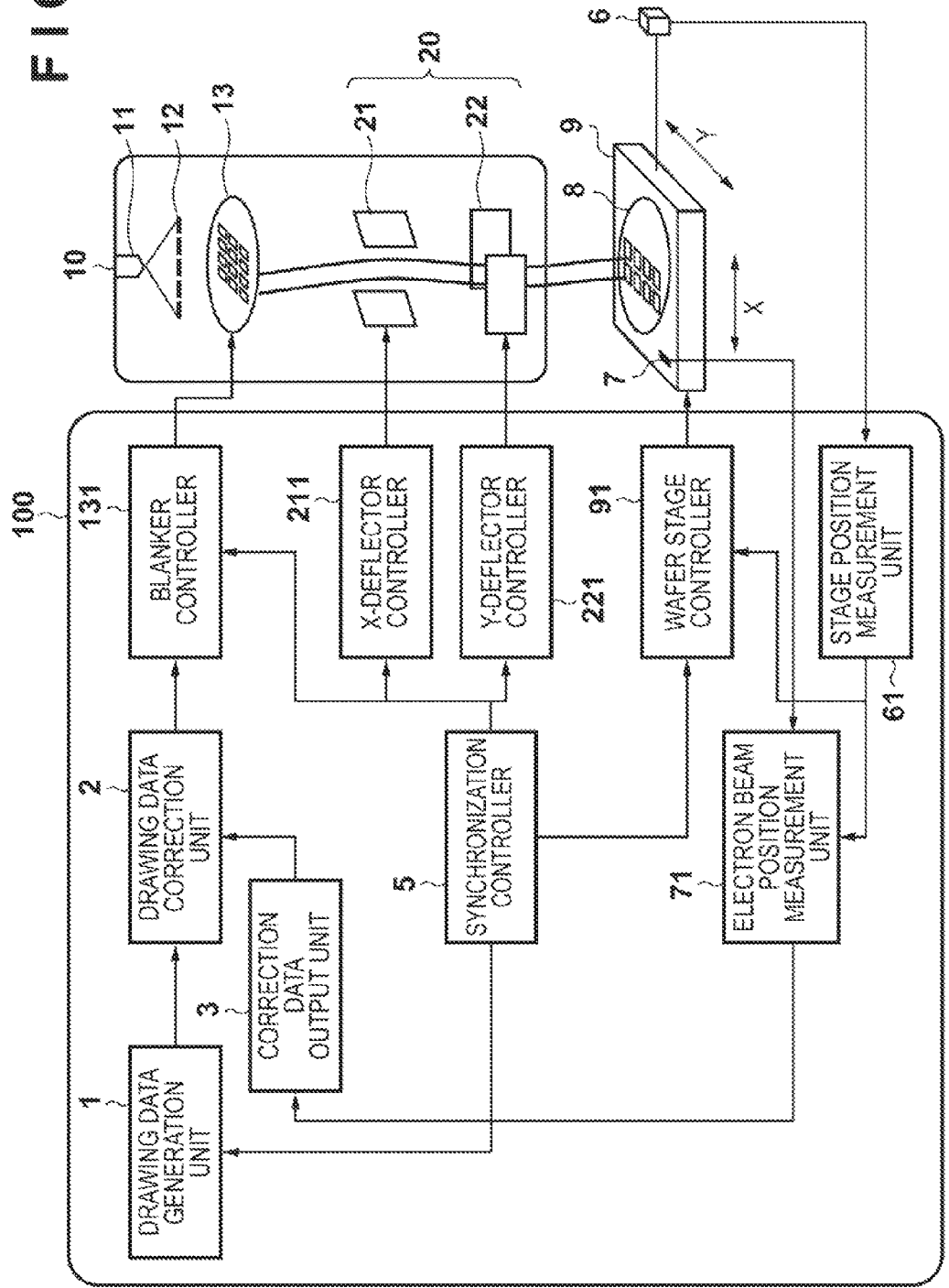

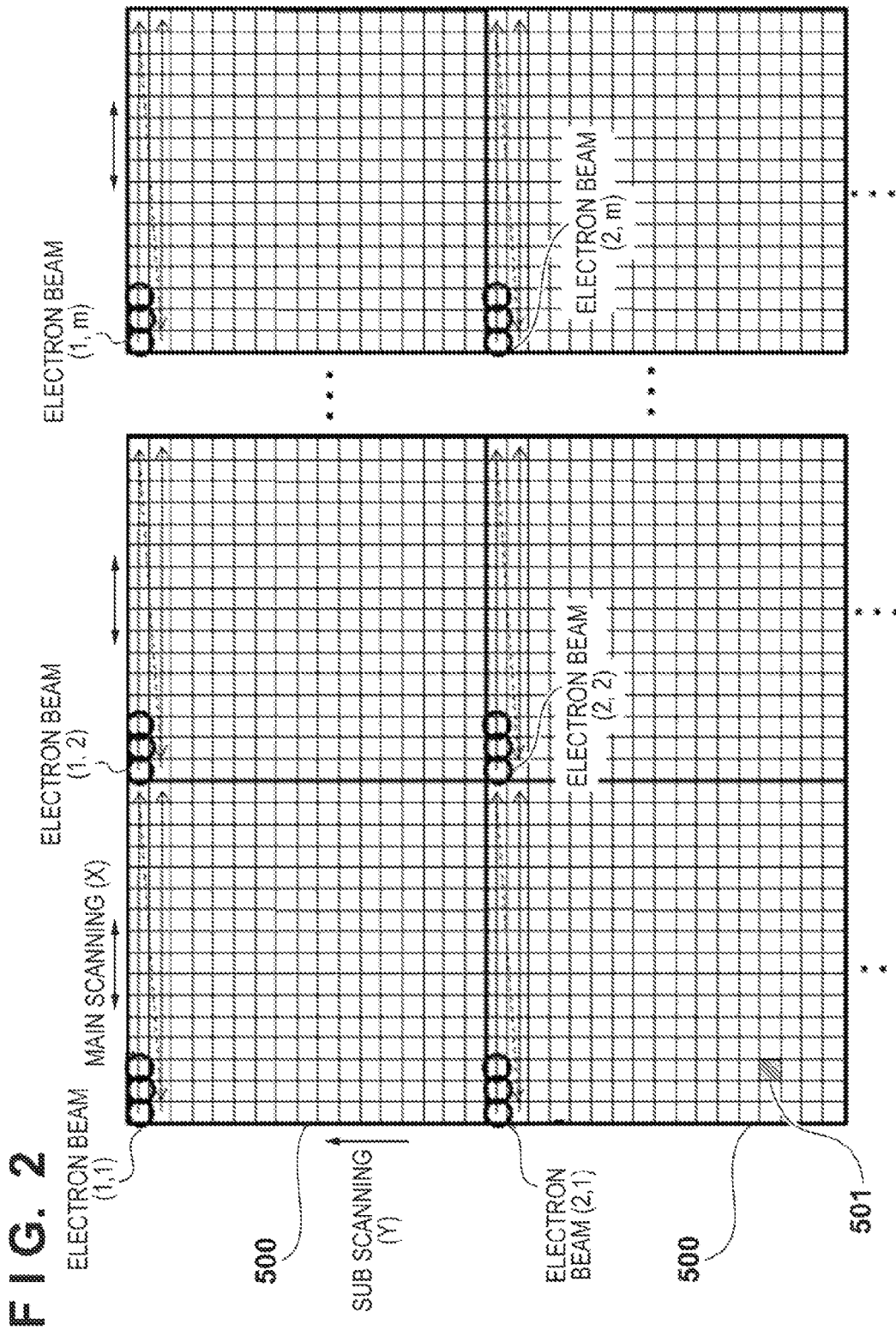

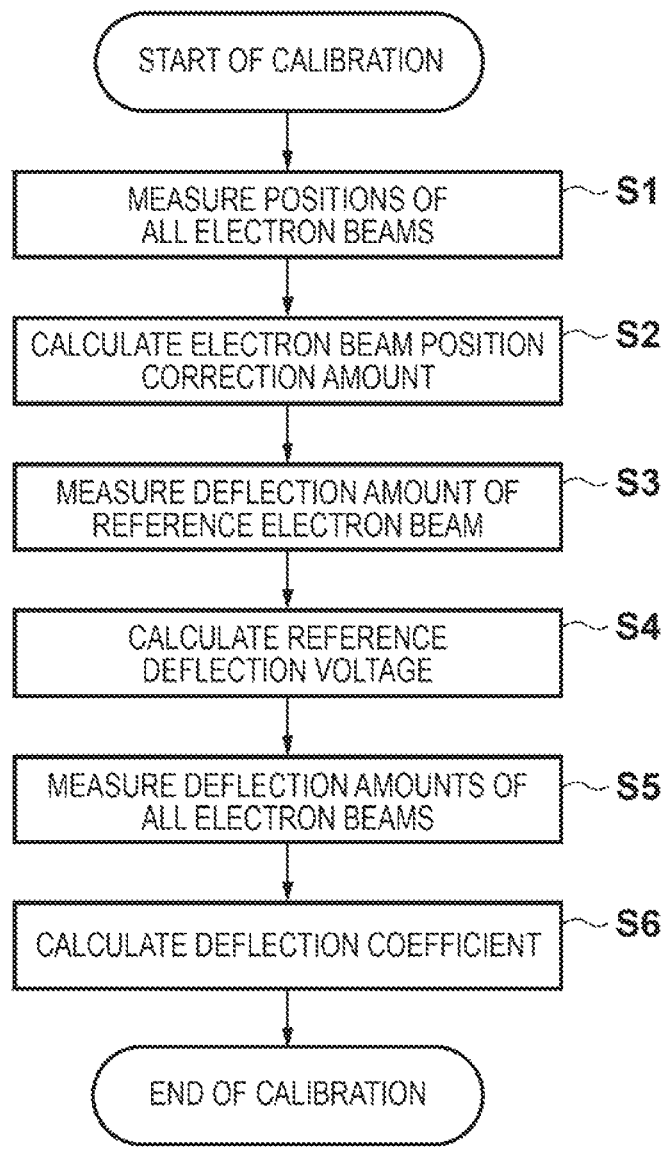

SCANNING APPARATUS, DRAWING APPARATUS, AND METHOD OF MANUFACTURING ARTICLE

BACKGROUND OF THE INVENTION

1. Field of the Invention

The present invention relates to a scanning apparatus which performs scan on an object with a charged particle beam, a drawing apparatus which includes the scanning apparatus and performs drawing on a substrate, and a method of manufacturing an article using the drawing apparatus.

2. Description of the Related Art

A charged particle beam irradiation apparatus blanks a charged particle beam, emitted by a charged-particle source, in accordance with drawing data while making a deflector scan the charged particle beam to irradiate a predetermined position on a sample with a predetermined amount of charged particle beam. A charged particle beam drawing apparatus blanks a charged particle beam, emitted by a charged-particle source, in accordance with drawing data while making a deflector scan the charged particle beam to irradiate a predetermined position on a substrate with a predetermined amount of charged particle beam, thereby drawing a circuit pattern on the substrate. The blanking is an operation of switching between ON and OFF of the irradiation of the substrate with a charged particle beam. Controlling the timing of this switching operation makes it possible to control the time taken to irradiate a unit region with a charged particle beam. Also, the deflector can change the deflection amount of a charged particle beam by controlling a voltage applied across the electrodes. The drawing data is circuit pattern bitmap data generated from CAD data of circuit design. The charged particle beam drawing apparatus performs drawing in accordance with the drawing data, and therefore requires no circuit pattern mask used in the conventional exposure apparatus. Hence, various developments are in progress in order to reduce the running cost intended for a miniaturization process of increasing the mask cost, and limited production of a wide variety of products which require a large number of masks. The current mainstream charged particle beam drawing apparatus is an electron-beam exposure apparatus which uses an electron beam. An electron-beam exposure apparatus will be taken as an example hereinafter.

The electron-beam exposure apparatus performs drawing while scanning an electron beam, and therefore has a low throughput. Hence, to improve the throughput, a method of drawing by simultaneously using a large number of electron beams has been proposed. In this case, it is possible to set a deflector for each electron beam to control its deflection amount. However, deflector electrodes, electrode driving circuits, applied voltage command circuits, and wiring lines which connect them to each other are required in numbers equal to the number of electron beams, entailing a high cost. Also, the requirement of a large number of circuits increases the probability that a failure will occur, thus increasing the maintenance load. For this reason, a method of guiding electron beams between the electrodes of one deflector to collectively deflect them is used.

When electron beams are collectively deflected using one deflector, it is desired to deflect all electron beams in the same amount in the same direction. However, the deflection amount is different for each electron beam if the electric field produced between the deflector electrodes is not uniform. In such a case, because the applied voltage cannot be adjusted individually for each electron beam, International Publication No. 2010/134018 discloses a method of expanding/contracting drawing data in accordance with the deflection amount of each electron beam to draw a pattern at a desired position on a substrate. Also, because an error occurs in the relationship between the applied voltage and the deflection amount of each electron beam due, for example, to nonuniformity of the electric field between the deflector electrodes, Japanese Patent No. 4074240 proposes a method of correcting the applied voltage in accordance with the deflection amount using a minimum amount of data to obtain a desired deflection amount.

A more uniform electric field can be produced when the electrodes used in the deflector are larger and are more sufficiently spaced apart from the region through which each electron beam passes. However, the use of such electrodes increases the size and cost of the deflector. Under the circumstances, the electric field between the deflector electrodes is not uniform and considerably varies not only in strength but also in direction especially near the ends of the electrodes. Therefore, electron beams which pass near the ends of the electrodes generate errors not only in the amount of deflection but also in the deflection direction with respect to desired values. In International Publication No. 2010/134018, drawing data is expanded/contracted for each electron beam to draw a predetermined pattern even if an error occurs in the deflection amount, but an error of the deflection direction is not corrected. Also, International Publication No. 2010/134018 describes neither an obtaining method nor a holding method for correction data indicating the amount of expansion/contraction of drawing data. Also, as the number of electron beams increases to improve the throughput, it becomes more difficult to correct errors for each electron beam. More specifically, since an enormous amount of correction data is set for each electron beam, the cost for holding data using, for example, a memory increases. Also, the measurement time for obtaining correction data, and the update time of the correction data become considerable.

In Japanese Patent No. 4074240, in one electron beam, correction data is set for each region having a size that changes depending on the deflection amount, thereby reducing the required amount of correction data. However, it is necessary to provide correction data corresponding to a plurality of regions for each electron beam. Accordingly, with an increase in number of electron beams, the amount of correction data, the measurement time for obtaining correction data, and the update time of the correction data become considerable as well.

SUMMARY OF THE INVENTION

The present invention provides, for example, a technique advantageous in compensating for a deflection error, of each of a plurality of charged particle beams, generated by a scanning deflector which collectively deflects the plurality of charged particle beams and performs scan on an object with the deflected plurality of charged particle beams.

The present invention in its one aspect provides a scanning apparatus which performs scan on an object with a charged particle beam, the apparatus comprising: a blanking deflector configured to individually blank a plurality of charged particle beams based on control data; a scanning deflector configured to collectively deflect the plurality of charged particle beams to perform the scan; and a controller, wherein the controller is configured to hold first data used to obtain error in a scanning amount and a scanning direction of the scanning deflector relative to a reference scanning amount and a reference scanning direction with respect to each of the plurality of charged particle beams, and to generate the control data based on the first data so that the scan is performed for a target region on the object.

Further features of the present invention will become apparent from the following description of exemplary embodiments with reference to the attached drawings.

BRIEF DESCRIPTION OF THE DRAWINGS

FIG. 1 is a view showing the configuration of an electron-beam exposure apparatus in the present invention;

FIG. 2 is a view showing the procedure of drawing with a plurality of electron beams;

FIG. 7 is a flowchart showing a calibration process in the first embodiment;

DESCRIPTION OF THE EMBODIMENTS

Figure 3A:
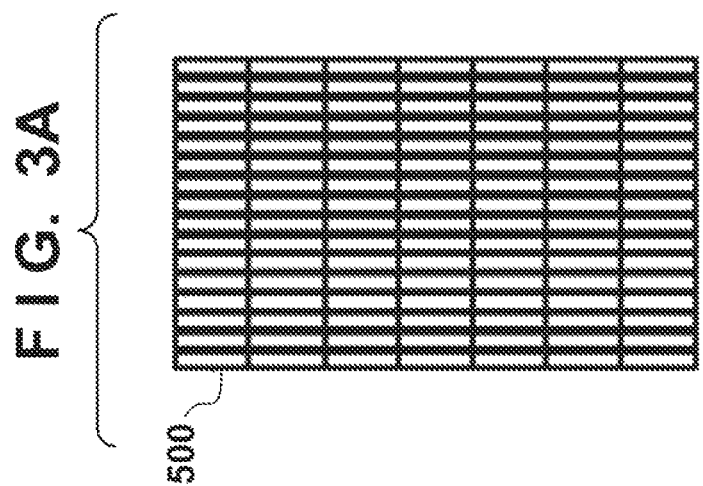
FIGS. 3A to 3C are views illustrating examples of the arrangements of drawing areas of a plurality of electron beams.

Embodiments of the present invention will be described below with reference to the accompanying drawings. In the following embodiments, an electron-beam exposure apparatus will be described as an irradiation apparatus which irradiates an object with a plurality of charged particle beams based on irradiation data indicating the target position on the object to be irradiated with each charged particle beam, and the target dose of this charged particle beam. However, the present invention is also applicable to charged particle beam irradiation apparatuses other than a charged particle beam drawing apparatus, such as an electron microscope and an ion beam injection apparatus. The present invention is moreover applicable to an irradiation apparatus which uses an ion beam other than an electron beam as a charged particle beam.

First Embodiment

FIG. 1 shows the configuration of an electron-beam exposure apparatus in the first embodiment. An electron optical system 10 is a multibeam electron optical system which generates an electron beam to be guided onto a substrate (wafer) 8. An electron beam emitted by an electron gun 11 is split into a plurality of beams by apertures 12. The plurality of split electron beams are individually blanked by a blanking deflector (blanker) 13 based on control data. The plurality of electron beams having passed through the blanker 13 are collectively deflected and scanned by two scanning deflectors (an X-deflector 21 and a Y-deflector 22) to irradiate a predetermined position on the wafer 8 set on a substrate stage (wafer stage) 9.

A drawing data generation unit 1 generates drawing data drawn by the blanker 13, based on design data created by circuit design CAD. The generated drawing data is bitmap data indicating the pattern information of a semiconductor circuit. The drawing data generation unit 1 may directly generate drawing data from CAD design data, or accumulate generated drawing data in, for example, a memory and read it out. The drawing data generated by the drawing data generation unit 1 undergoes various types of correction by a drawing data correction unit 2 in accordance with the states of the electron-beam exposure apparatus and wafer 8, such that a desired position on the wafer 8 is irradiated with an electron beam having a desired intensity, thereby generating drawing data to be actually used for drawing. The various types of correction can include correction for compensating for a position error of each electron beam, correction for compensating for the intensity of this electron beam, and correction for overlaying a drawing pattern on a circuit pattern formed on the wafer 8.

A blanker controller 131 drives the blanker 13 in accordance with drawing data to control the passage time of each electron beam. An X-deflector controller 211 and a Y-deflector controller 221 drive the X-deflector 21 and the Y-deflector 22, respectively, to collectively deflect the electron beams in the X- and Y-directions. This makes it possible to draw a predetermined pattern at a predetermined position on the surface of the wafer 8. The position of the wafer stage 9 with reference to the electron optical system 10 is calculated by a stage position measurement unit 61 based on the value measured by a position sensor 6. The wafer stage 9 can move in the X- and Y-directions, and position the wafer 8 at the electron beam irradiation position in response to a command from a wafer stage controller 91 based on the calculated stage position. A synchronization controller 5 controls the blanker controller 131, X-deflector controller 211, Y-deflector controller 221, and wafer stage controller 91 in accordance with a predetermined drawing procedure. Upon this operation, the blanker 13, X-deflector 21, Y-deflector 22, and wafer stage 9 operate in synchronism with each other, thereby drawing a circuit pattern at a predetermined position on the wafer 8. Each of the controllers 5, 131, 211, 221, and 91, the drawing data generation unit 1, the drawing data correction unit 2, a correction data output unit 3, an electron beam position measurement unit 71, and the stage position measurement unit 61 constitute a controller 100.

FIG. 2 illustrates a detailed example of the procedure of drawing a semiconductor chip. Assume that the X-direction is the main scanning direction, and the Y-direction is the sub scanning direction. Assume also that m electron beams are juxtaposed in the X-direction, and n electron beams are juxtaposed in the Y-direction. First, the X-deflector 21, Y-deflector 22, and wafer stage 9 are controlled so that an upper left drawing grid 501 in a drawing area 500 of each electron beam is irradiated with this electron beam. The grid size is set to, for example, a half of the line width, that is, 11 nm for a line width of 22 nm, and 8 nm for a line width of 16 nm. In this case, the blanker 13 is driven to irradiate each drawing grid with an electron beam for a predetermined period of time determined for each drawing grid based on drawing data, thereby drawing a predetermined pattern. Each electron beam sequentially moves in the rightward, main scanning (X−) direction (a solid arrow) by the X-deflector 21, and a predetermined pattern is sequentially drawn on the grids with this movement. When drawing on one row is complete, the X-deflector 21 returns to the left end (a broken arrow) and starts drawing on the next row. At this time, the wafer stage 9 moves at a constant velocity in the upward, sub scanning (Y−) direction. The Y-deflector 22 adjusts the deflection amount with the movement of the wafer stage 9, and returns to the initial position to start drawing on the next row upon completion of drawing on one row. Therefore, the Y-deflector 22 can deflect a grid width corresponding to one row. By repeating this operation, a predetermined pattern can be drawn in the drawing area 500 of each electron beam. By parallelly drawing a predetermined pattern in adjacent drawing areas 500 with respective electron beams, this pattern can be drawn in a wide region with a high throughput. For example, when drawing is done using 100× 100=10,000 electron beams, the throughput can be improved to ten thousand times. Although FIG. 2 illustrates an example in which the sequence of drawing in the main scanning direction has the same direction on each row, drawing can also be done so that the direction of the sequence of drawing reverses for every other row.

Figure 3B:
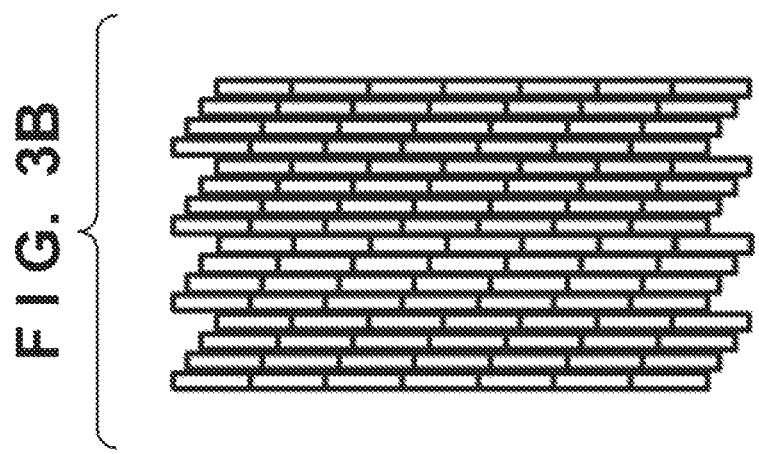
Figure 3C:
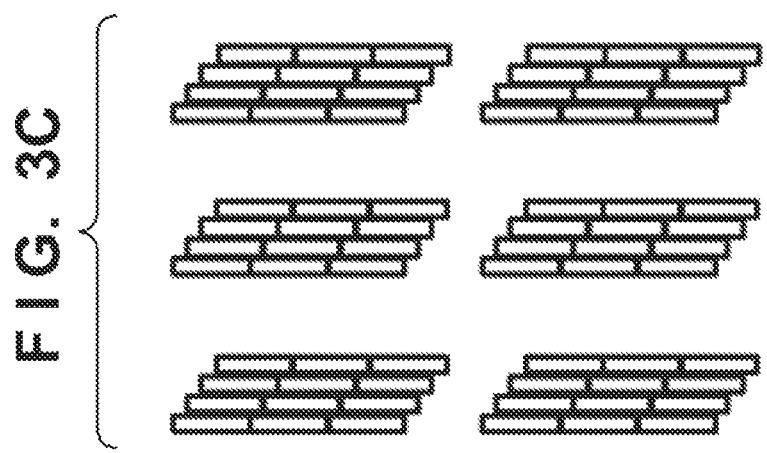

FIGS. 3A to 3C illustrate examples of the arrangements of drawing areas 500. Each electron beam is guided to the same position in each drawing area 500. Referring to FIG. 3A, drawing areas 500 are arranged in a grid pattern, similarly to that shown in FIG. 2. Referring to FIG. 3B, drawing areas 500 are arranged in a staggered pattern in the Y-direction. This makes it possible to set wide spacings in the X-direction between electron beams on the same column, so it becomes easy to arrange, for example, wiring lines and cooling pipes and, in turn, to fabricate the apertures 12 and blanker 13. Referring to FIG. 3C, the drawing areas 500 shown in FIG. 3B are further divided into groups to ensure wiring line and cooling pipe spaces and to ensure a given strength upon equipment with beams. The wafer stage 9 is further moved in the X-direction to draw a predetermined pattern in the divided spacings.

Figure 4:
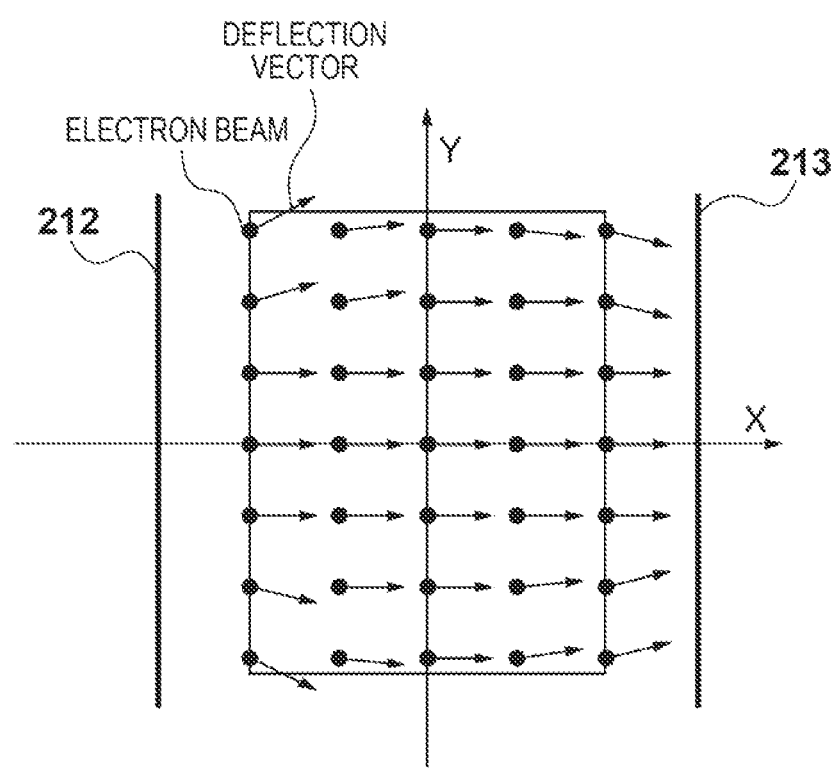
FIG. 4 is a view showing the deflection directions of a plurality of electron beams in a deflector.

FIG. 4 is a schematic view of the arrangement of electron beams in the X-deflector 21 when viewed from the optical axis direction of each electron beam. Note that coordinates (X, Y) are deflector coordinates representing the arrangement of electron beams in the deflector, and have, as their origin, the center of an electron beam passage region in the deflector. A region through which electron beams pass is sandwiched between parallel plate electrodes 212 and 213 from two sides along the X-direction. For the sake of simplicity, only a small number of electron beams are shown in FIG. 4, but a large number of electron beams pass through the electron beam passage region in correspondence with the arrangement of drawing areas shown in one of FIGS. 3A to 3C in practice. Electron beams may be deflected using one deflector, or may be grouped to set deflectors in one-to-one correspondence with groups. In the case of the arrangement of drawing areas shown in, for example, FIG. 3C, deflectors may be set in one-to-one correspondence with groups.

An electric field is produced between the electrodes by applying a voltage across the electrodes. Each electron beam is deflected in accordance with the direction and strength of the electric field. For example, each electron beam is deflected in the rightward direction, as described by a deflection vector indicated by an arrow in FIG. 4, by applying a negative voltage to the electrode 212, and a positive voltage to the electrode 213. At this time, to obtain a correct drawing result, all electron beams are expected to be deflected and scanned in the same amount in the same direction. However, the electric field between the electrodes is not uniform especially at the ends of the electrodes, so the strength of the electric field varies and the direction of the electric field is not exactly the X-direction. This is because the electric field spreads outwards from the parallel plate electrodes 212 and 213. The uniformity of the electric field also degrades as the electrodes are not parallel to each other due to manufacturing errors. Note that the same applies to the Y-deflector 22 upon replacement of the X-axis with the Y-axis. That is, the deflection amount (scanning amount) and deflection direction (scanning direction) of at least one of a plurality of electron beams by each of the X-deflector 21 and Y-deflector 22 have errors with respect to a reference deflection amount (reference scanning amount) and a reference deflection direction (reference scanning direction), respectively. The reference deflection amount and the reference deflection direction are the deflection amount and the deflection direction, respectively, at, for example, the center of the electron beam passage region in the deflector.

Figure 5A:
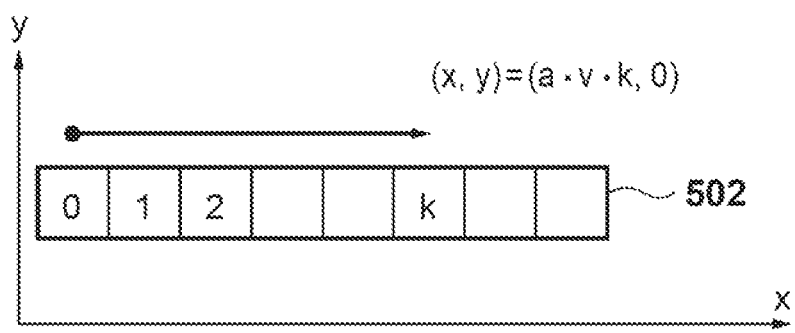
FIGS. 5A and 5B are views showing an error of the drawing position generated by an error of the deflection direction.
Figure 5B:
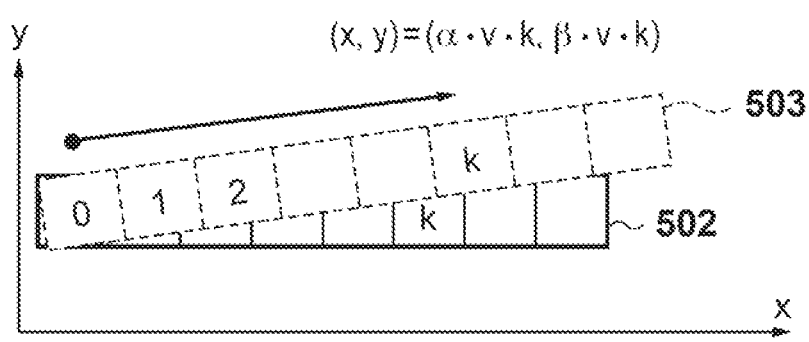

FIGS. 5A and 5B show the influence that the differences in direction and strength of the electric field from a predetermined direction and strength have on the deflection error and the drawing result. Note that coordinates (x, y) are local coordinates for each electron beam, and represent the position of a beam grid 503 to actually undergo drawing relative to a data grid (target region) 502 to undergo drawing. The coordinates (x, y) have, as their origin, a data grid position to undergo drawing while the deflector is kept stopped, so the midpoint of the drawing area 500 is normally defined as a local coordinate origin to uniformly deflect each electron beam to the two sides of the origin upon reverse of the direction of the electric field. Alternatively, a grid to undergo drawing first in the drawing area may be defined as an origin to apply a voltage across the deflector electrodes so as to deflect it in one direction. The following description assumes that each electron beam is used to correctly draw a predetermined pattern at a desired origin grid position while the deflector is kept stopped.

FIG. 5A shows the state in which a predetermined electric field is obtained. By applying a predetermined voltage corresponding to the number k of the data grid 502 across the electrodes, each electron beam can be deflected as:

$$(x,y)=(a \cdot v \cdot k, 0) \quad (1)$$

where v is the unit voltage applied to the deflector, so the actually applied voltage is v·k in accordance with the parameters of each grid, and a is the deflection sensitivity to v. Since the electric field runs exactly in the X-direction, the electron beam is not deflected in the Y-direction.

FIG. 5B shows the case wherein the electric field has a direction different from a predetermined direction. The deflection amount at this time is given by:

$$(x,y)=(\alpha \cdot v \cdot k, \beta \cdot v \cdot k) \quad (2)$$

where (α, β) is a two-dimensional deflection vector.

When the strength of the electric field varies, α≠a, so a predetermined deflection amount cannot be obtained in the X-direction. Also, when the direction of the electric field varies, β≠0, so other components are generated in the Y-direction. When this happens, the result of actually deflecting each electron beam exhibits the beam grid 503 indicated by a broken line, which does not coincide with the data grid 502 indicated by a solid line. The deflection vector (α, β) is data (first data) indicating errors in deflection amount and deflection direction of each electron beam with respect to a reference deflection amount and a reference deflection direction, respectively.

As the number of electron beams increases, the deflection width of each electron beam becomes sufficiently smaller than the distance between the electrodes. When, for example, 100×100 electron beams are used, the deflection width becomes 100/1 or less of the distance between the electrodes. Hence, the electric field can be regarded as uniform within the range of the deflection width of each electron beam. This means that α and β are constant in each individual electron beam. However, the deflector coordinates are different for each electron beam, so α and β have values different for each electron beam. If a deflector is set individually for each electron beam, the beam grid 503 of this electron beam can be matched with the data grid 502 by individually adjusting the voltage applied to the deflector. However, as shown in FIG. 4, when one deflector collectively deflects a large number of electron beams, the voltage applied to it cannot be adjusted individually for each electron beam. This means that all beam grids 503 of electron beams cannot be matched with data grids 502. Hence, the drawing data is corrected to correctly perform drawing even when the beam grid 503 is different from the data grid 502.

Figure 6A:
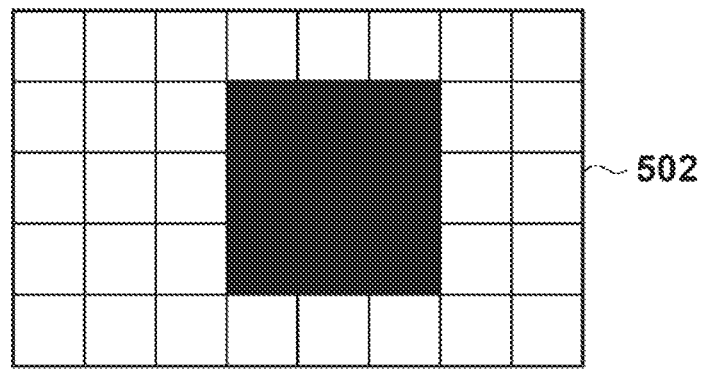
FIGS. 6A to 6C are views showing a method of correcting drawing data to correct the influence of the error of the drawing position.
Figure 6B:
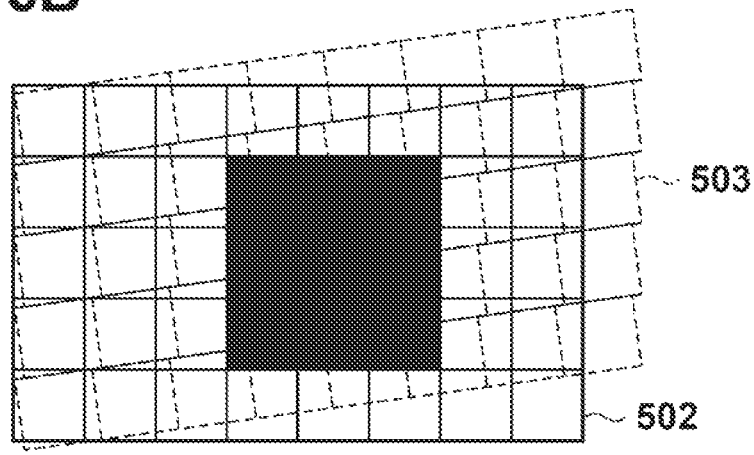
Figure 6C:
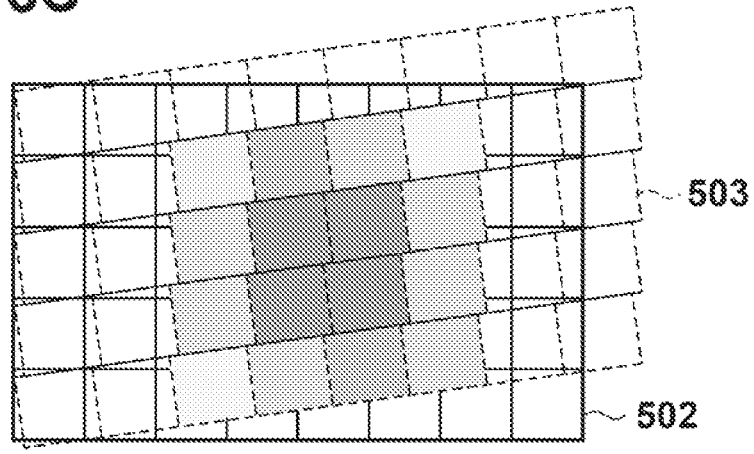

FIGS. 6A to 6C illustrate examples of how to correct drawing data. FIG. 6A shows drawing data indicating the data grid 502 as a target region on the substrate to be irradiated with an electron beam, and its target dose. Referring to FIG. 6A, drawing is done by irradiating a 3×3 region with an electron beam. Assume that the beam grid 503 of an electron beam then becomes a beam grid as indicated by a broken line of FIG. 6B due to errors in deflection amount and deflection direction. Since each electron beam is used to draw a predetermined pattern along the beam grid 503, it is necessary to assign drawing data of the data grid 502 to originally undergo drawing to the beam grid 503. To meet this requirement, the area overlapping the data grid to undergo drawing is evaluated for each beam grid 503. The electron beam intensity for the beam grid 503 is determined in accordance with the drawing area in the beam grid 503, and the intensity of an electron beam used to irradiate this area. That is, drawing data is corrected so as to irradiate a target region with an electron beam in a target dose corresponding to the drawing data, using an electron beam to be guided to the target region, and an electron beam to be guided to a position adjacent to the target region. In an example shown in FIGS. 6A to 6C, as shown in FIG. 6C, a 2×2 central beam grid 503 completely falls within the drawing range, and therefore fully undergoes drawing. A 4×4 beam grid 503 around the 2×2 central beam grid 503 includes both the drawing range and non-drawing range, so the electron beam intensity is determined in accordance with the area of the drawing range. For example, the electron beam intensities of 12 grids other than four central grids among 4×4 grids are 70% for two grids, 50% for six grids, 20% for two grids, and 10% for two grids. The electron beam intensity is adjusted by controlling the ON time of each electron beam for each grid using the blanker. In this way, drawing data for the beam grid 503 is generated from the drawing data of the data grid 502 to perform drawing using the drawing data.

To generate drawing data for the beam grid 503, it is necessary to obtain a deflection vector (α, β) for each electron beam. This is done by detecting the position of each electron beam using an electron beam sensor (detector) 7, and measuring the deflection amount. A Faraday cup or a CCD sensor, for example, is used as the electron beam sensor 7. The electron beam sensor 7 moves the wafer stage 9 so as to irradiate it with an electron beam to be measured, thereby measuring the electron beam intensity. The electron beam position measurement unit 71 calculates the position of an electron beam with reference to the electron optical system 10 based on the value measured by the electron beam sensor 7, and the stage position information at the time of measurement. α and β can be obtained from the difference between the reference position of each electron beam while the deflector is kept stopped (while no voltage is applied across the deflector electrodes) and the position of this electron beam while the deflector is driven. Obtained α and β are held in the correction data output unit 3, and used to correct the beam grid 503 by the drawing data correction unit 2. Note that the correction data output unit 3 holds various correction parameters other than α and β.

A calibration process of the irradiation position and deflection amount of each electron beam by the electron beam position measurement unit 71 will be described with reference to FIG. 7. In step S1, the electron beam position measurement unit 71 performs position measurement using the electron beam sensor 7 for all electron beams while the deflectors 21 and 22 are kept stopped (first deflection state). With this operation, the difference between the data grid 502 and the beam grid 503 can be measured at the local coordinate origin of each electron beam. In step S2, the electron beam position measurement unit 71 calculates an electron beam position correction amount (offset amount) based on the measurement result obtained in step S1. The electron beam position correction amount calculated in step S2 constitutes second data indicating an error in irradiation position of each charged particle beam while this charged particle beam is not deflected by the deflector. The electron beam position measurement unit 71 obtains an offset amount which errors the drawing data in the X- and Y-directions so as to match the origins of the data grid 502 and beam grid 503. The obtained offset amount is stored in the correction data output unit 3 and used for correction.

In step S3, the electron beam position measurement unit 71 uses to measure the electron beam irradiation position of a reference electron beam using the electron beam sensor 7 while a predetermined voltage is applied across the deflector electrodes. The reference electron beam is normally an electron beam around the origin of the deflector coordinates (X, Y), that is, around the center of the deflector. At this time, a plurality of electron beams around the center of the deflector may be measured to determine their average as a measurement result. A voltage nearly corresponding to the deflection width of the drawing area 500 can also be used. In step S4, the electron beam position measurement unit 71 determines a deflection voltage which matches the data grid 502 and the beam grid 503 for the reference electron beam, based on the measurement result obtained in step S3. Upon this operation, a deflection sensitivity a in equation (1) is obtained to determine a unit applied voltage v. The obtained unit applied voltage v is sent to the X-deflector controller 211 to determine a voltage applied to the X-deflector 21.

In step S5, the electron beam position measurement unit 71 measures the electron beam irradiation position using the electron beam sensor 7 while a voltage (reference deflection voltage) corresponding to the deflection width of the drawing area 500 determined from the unit applied voltage v obtained in step S4 is applied across the deflector electrodes (second deflection state). Although it is desired to measure all electron beams, they may be thinned at a predetermined interval to measure some of them, because adjacent electron beams generate measurement results with little difference. Also, a plurality of adjacent electron beams may be measured to determine their average as a measurement result. In step S6, the electron beam position measurement unit 71 obtains the deflection amount of each electron beam when a voltage is applied to the deflector, based on the measurement results obtained in steps S1 and S5. Upon this operation, α and β in equation (2) are determined. Obtained α and β are stored in the correction data output unit 3 and used for correction.

Figure 8:
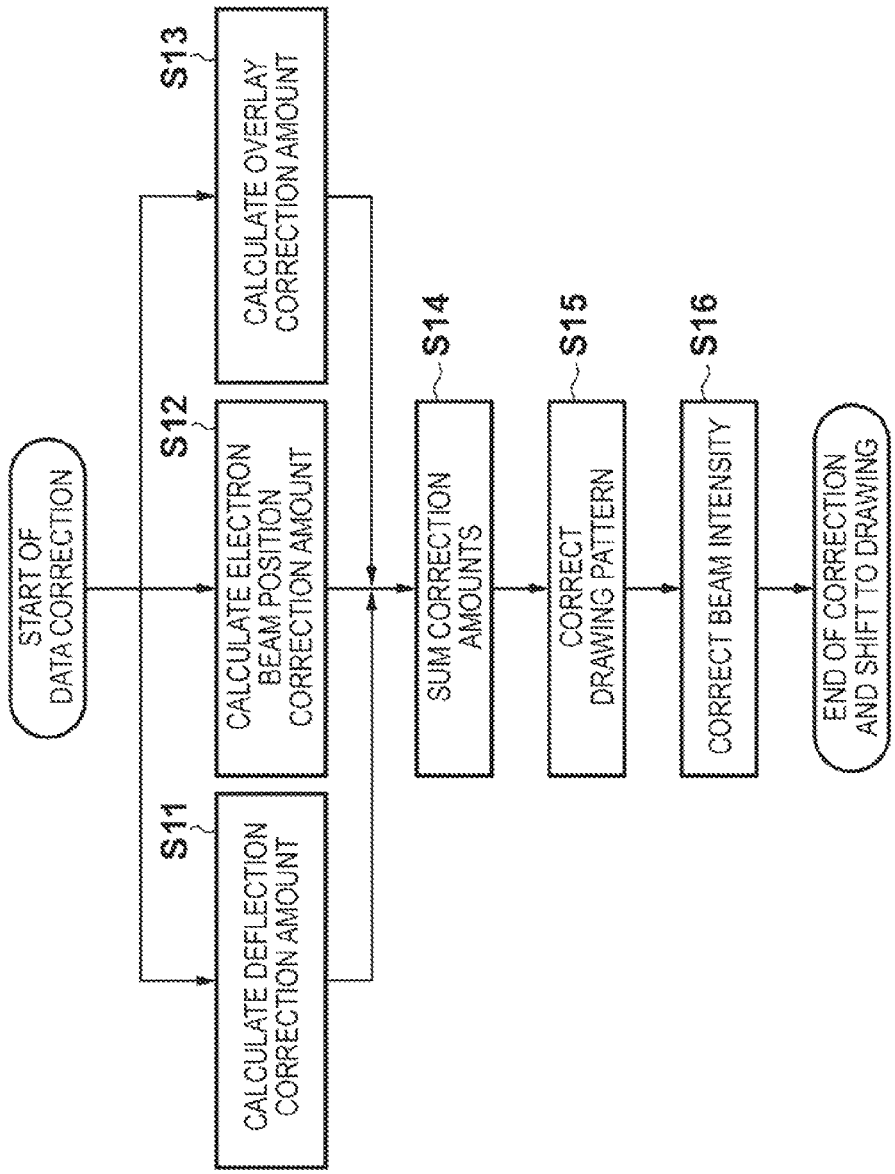
FIG. 8 is a flowchart showing a correction process in the first embodiment.

A correction process of the position and amount of deflection of each electron beam will be described next with reference to FIG. 8. In step S11, the drawing data correction unit 2 reads out α and β stored in the correction data output unit 3 to calculate the deflection correction amount of beam grid k to undergo drawing for the coordinate values (x, y). In step S12, the drawing data correction unit 2 reads out the offset amount of each electron beam stored in the correction data output unit 3 to calculate an electron beam position correction amount for beam grid k to undergo drawing.

In step S13, a drawn circuit pattern mark position is measured for each wafer, independently of the above-mentioned calibration process. Based on this information, the drawing data correction unit 2 obtains the amount of error, amount of rotation, and magnification of drawing data to be used for drawing upon precise overlay of the drawn circuit pattern on the wafer to calculate the coordinate position of the data grid 502 in accordance with these parameters. In step S14, the drawing data correction unit 2 sums the coordinate values upon individual correction, which are calculated in steps S11, S12, and S13, thereby obtaining the coordinate value (x, y) of beam grid k to undergo drawing.

In step S15, the drawing data correction unit 2 reads out pixel data corresponding to the calculated beam grid coordinate values from the drawing data generated by the drawing data generation unit 1 to obtain drawing data indicating the electron beam intensity, that is, the electron beam ON time using the above-mentioned method based on the area ratio. In step S16, the drawing data correction unit 2 reflects correction for the intensity of each electron beam on the drawing data as needed. The drawing data correction unit 2 supplies the obtained drawing data to the blanker controller 131 to make the synchronization controller 5 drive the blanker 13 in synchronism with the set of deflectors 20 and the wafer stage 9. The above-mentioned correction operation is repeatedly executed for each beam grid. A large number of process circuits may be set to parallelly process a plurality of grids and a plurality of electron beams.

As described above, the deflection amount of each electron beam is measured to correct drawing data, thereby deflecting a large number of electron beams using only one deflector. This makes it possible to accurately perform drawing even if errors are generated in the deflection amount and deflection direction of each electron beam based on the electric field distribution in the deflector.

Second Embodiment

It takes much time to individually measure the amounts of deflection of a large number of electron beams in step S5 described in the first embodiment. On the other hand, a deflection vector (α, β) can be obtained by simulation. More specifically, an electric field generated by a deflector is simulated to obtain the state (strength and direction) of the electric field at each electron beam position. Further, the behavior of each electron beam as this electron beam passes through the obtained electric field is simulated to obtain a deflection vector (α, β). The deflection vector of each electron beam obtained by simulation can be stored in the correction data output unit 3 and used for correction. A deflection vector need only be calculated in advance during, for example, design. Hence, steps S5 and S6 can be omitted from the calibration process in the first embodiment shown in FIG. 7. A correction process of drawing data at this time is the same as in that of the first embodiment shown in FIG. 8. In the second embodiment, a process of measuring a deflection vector can be omitted from the calibration process, thus significantly shortening the calibration time.

Third Embodiment

The deflection vector of each electron beam shown in FIG. 4 has a given correlation with the deflector coordinates. Especially when electrodes with a shape symmetrical about a coordinate system, such as parallel plate electrodes, are used, a deflection vector can be expressed as a relatively simple approximation for the coordinate values. Since the distribution of a deflection amount α in the X-direction in equation (2) is axisymmetrical about the X- and Y-axes, its approximation can be expressed as an even-order polynomial such as a quadratic or quartic polynomial. This approximation can be expressed as, for example, a quadratic polynomial:

$$\alpha = f(X, Y) \qquad (3)$$
$$= 1 + f10X + f20X^2 + f01Y + f02Y^2 + f11XY$$

where the constant of the first term is 1 assuming that a unit applied voltage v is calibrated in steps S3 and S4.

Since the distribution of a deflection amount β in the Y-direction is point-symmetrical about the X- and Y-axes, its approximation can be expressed as an odd-order polynomial such as a linear or cubic polynomial. This approximation can be expressed as, for example, a cubic polynomial:

$$\beta = g(X, Y) \qquad (4)$$
$$= g00 + g10X + g20X^2 + g30X^3 + g01Y + g02Y^2 +$$
$$g03Y^3 + g11XY + g12XY^2 + g21X^2Y$$

With this expression, as long as the coefficients f10 and f11 in equation (3) and the coefficients g00 to g21 in equation (4) are obtained, a deflection vector (α, β) can be obtained based on equation (4) from the deflector coordinates (X, Y) of each electron beam. The types and coefficient values of equations (3) and (4) can be obtained by simulating the electric field of the deflector, as in the second embodiment. At this time, the order of the polynomial is determined so that the error between a deflection vector (α, β) obtained by an approximate polynomial and a directly obtained deflection vector (α, β) falls below a tolerance. Although the tolerance of the error varies depending on the accuracy and process condition of each unit of the drawing apparatus, the error of the beam grid determined based on the calculated deflection vector (α, β) desirably falls below about 1/10 of the grid size.

The types and coefficient values of equations (3) and (4) can also be obtained by measuring the deflection amount of each electron beam, as in the first embodiment. The coefficients of an approximate polynomial can be calculated using, for example, the least-squares method by substituting the deflection amount of each electron beam into the approximate polynomial. As for the types of equations (3) and (4), a low-order polynomial as mentioned above is desirably used so as to obtain a deflection vector by a small amount of calculation, a polynomial need not always be used. A trigonometric or exponential function can also be used.

Figure 9:
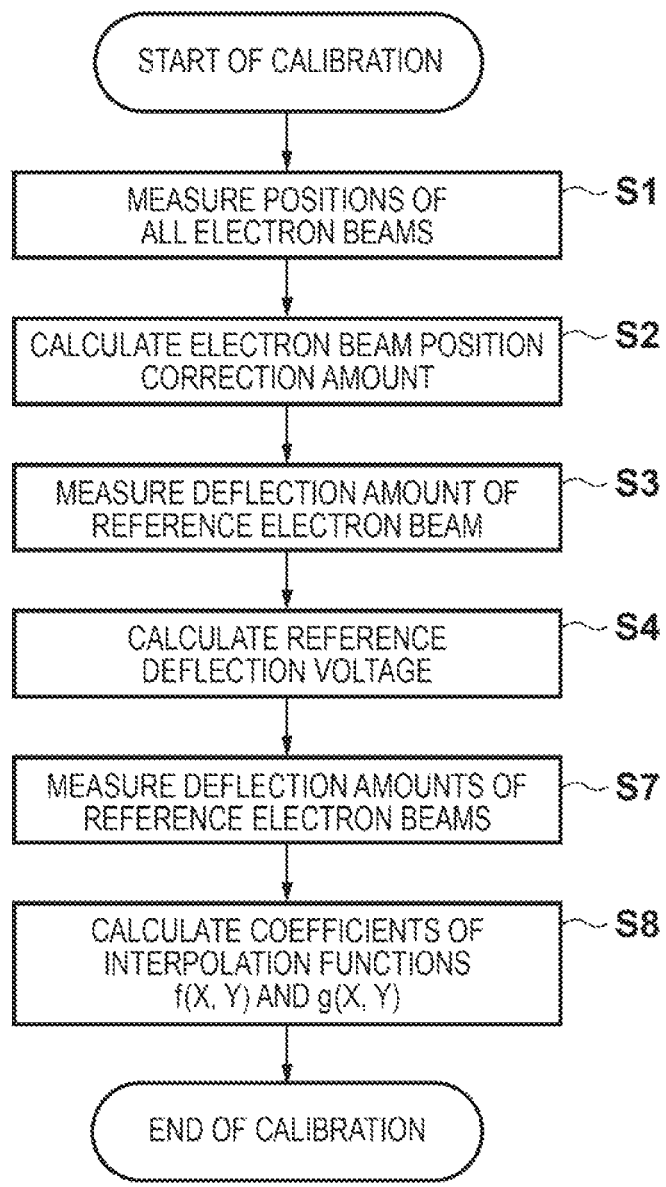
FIG. 9 is a flowchart showing a calibration process in the third embodiment.

A calibration process of the position and amount of deflection of each electron beam in this embodiment will be described with reference to FIG. 9. Unlike the process shown in the second embodiment, instead of calibration of the deflection amount, drawing can be done using approximate polynomial coefficients obtained from the measurement result or by simulation in advance. The case wherein calibration is performed with a change in state of the apparatus will be described herein. Steps S1 to S4 are the same as in the first embodiment.

In step S7, a voltage corresponding to the deflection width of a drawing area 500 determined from the unit applied voltage v obtained in step S4 is applied to the deflector electrodes for a reference electron beam. An electron beam position measurement unit 71 measures the electron beam position at that time using an electron beam sensor 7. Unlike step S5, in step S7, only reference electron beams in a number that allows the coefficients in equations (3) and (4) to be specified need only be measured. To improve the measurement accuracy, electron beams near the electrode ends considerably spaced apart from the vicinity of an origin serving as a reference are measured as reference electron beams. However, a plurality of adjacent electron beams may be measured to determine their average as a measurement result.

In step S8, the electron beam position measurement unit 71 obtains the deflection amount of each reference electron beam when a voltage is applied to the deflector, based on the measurement results obtained in steps S1 and S7. Upon this operation, $\alpha$ and $\beta$ in equation (2) are determined. Obtained $\alpha$ and $\beta$ are substituted into equations (3) and (4) to obtain the coefficients of the polynomials f and g using the least-squares method. The obtained coefficients are stored in a correction data output unit 3 and used for correction.

Also, depending on the variation factors, it is often unnecessary to individually obtain each coefficient.

$$\alpha = f(X, Y) \quad (3')$$
$$= 1 + (f10X + f20X^2 + f01Y + f02Y^2 + f11XY)F$$

$$\beta = g(X, Y) \quad (4')$$
$$= (g00 + g10X + g20X^2 + g30X^3 + g01Y + g02Y^2 + g03Y^3 + g11XY + g12XY^2 + g21X^2Y)G$$

For example, as long as the coefficients f10, f11, and g00 to g21 remain the same when $\alpha$ and $\beta$ are transformed into those in equations (3') and (4'), the coefficients F and G as representatives of the entire equations need only be calibrated. In this case, the number of electron beams which measure the amounts of deflection can further be reduced.

Figure 10:
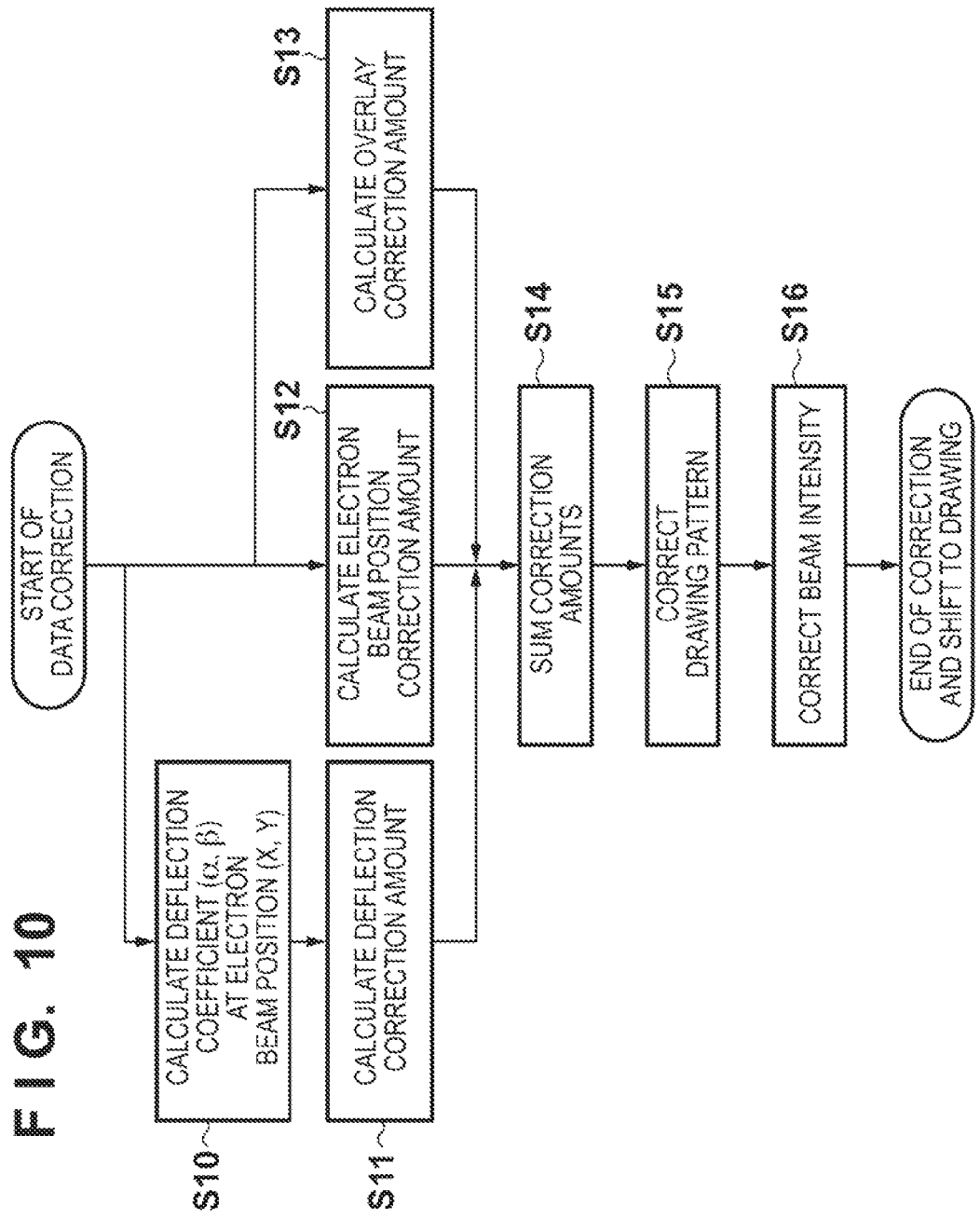
FIG. 10 is a flowchart showing a correction process in the third embodiment.

A correction process of the position and amount of deflection of each electron beam will be described next with reference to FIG. 10. Except for the addition of step S10, this process is the same as in FIG. 8 of the first embodiment. In step S10, a drawing data correction unit 2 reads out the coefficients of the polynomials f and g stored in the correction data output unit 3, and substitutes them into the polynomials f and g, together with the deflector coordinate values (X, Y) of each electron beam, thereby calculating $\alpha$ and $\beta$. This calculation can be done simply by a product-sum operation, so the amount of calculation increases only a little. In step S11, the drawing data correction unit 2 calculates the coordinate values (x, y) of beam grid k to undergo drawing, using $\alpha$ and $\beta$ calculated in step S10.

In the third embodiment, it is only necessary to measure the amounts of deflection of only a small number of reference electron beams, thus significantly shortening the calibration time. Also, although $\alpha$ and $\beta$ must be stored in the correction data output unit 3 for all electron beams in the first embodiment, only the coefficients F and G of the same polynomials f and g need only be stored for all electron beams in the third embodiment, thus greatly reducing the storage capacity.

Fourth Embodiment

Figure 11:
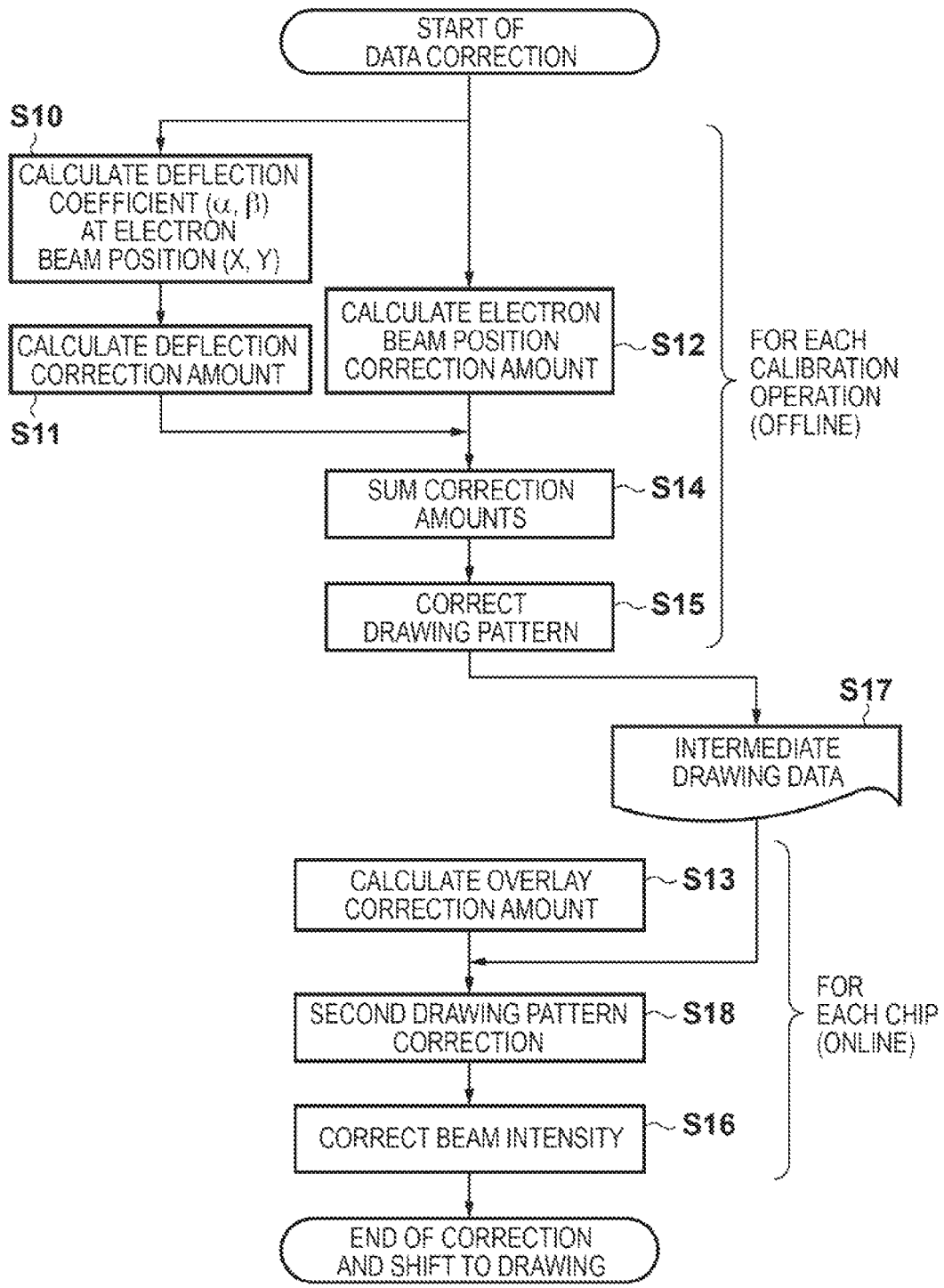
FIG. 11 is a flowchart showing a correction process in the fourth embodiment.

A correction process of the position and amount of deflection of each electron beam in the fourth embodiment will be described with reference to FIG. 11. The fourth embodiment is different from the third embodiment in that the correction process is divided into an offline process for each calibration operation and an online process for each chip. In the offline process, steps S10, S11, and S12 are performed, correction of only the position and amount of deflection of each electron beam is applied to drawing data, and intermediate drawing data is generated in step S17. Calibration is done when, for example, the drawing apparatus is started up, drawing of a plurality of wafers is complete, or a predetermined time has elapsed from the previous calibration operation. Note that the correction parameters are updated, so the drawing pattern is corrected with this operation.

On the other hand, the overlay correction amount is obtained in step S13 by measurement for each wafer, and the correction parameters are different for each chip having a pattern to be drawn on the wafer. Hence, steps S13, S18, and S16 are performed every time one chip undergoes drawing. In step S18, the overlay correction amount generated in step S13 is applied to the intermediate drawing data S17 generated in the offline process. In this embodiment, since the amount of process executed online can be reduced, the scale of the process circuit can also be reduced. The offline process can be executed in parallel with the calibration process, and therefore does not directly influence the throughput of the apparatus. Hence, the scale of the process circuit can be reduced using a software process to reduce the apparatus cost although the process time prolongs.

[Method of Manufacturing Article]

A method of manufacturing an article according to an embodiment of the present invention is suitable for manufacturing an article including a semiconductor device or an original (it can also be called, for example, a reticle or a mask). This manufacturing method can include a step of drawing a pattern on a substrate, coated with a photosensitive agent, using the above-mentioned charged particle beam drawing apparatus, and a step of developing the substrate having the pattern drawn on it. In manufacturing a device, this manufacturing method can also include subsequent known steps (for example, oxidation, film formation, vapor deposition, doping, planarization, etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-258217 filed Nov. 25, 2011, which is hereby incorporated by reference herein in its entirety.

What is claimed is:

1. A drawing apparatus which irradiates a plurality of charged particle beams on an object and thereby performs drawing a pattern on the object with the plurality of charged particle beams, the apparatus comprising:

a plurality of blankers configured to individually blank the plurality of charged particle beams to individually adjust intensities of the plurality of charged particle beams irradiated on the object;

a deflector configured to collectively deflect the plurality of charged particle beams to collectively change positions, irradiated with the plurality of charged particle beams, on the object; and a controller configured to control the plurality of blankers and the deflector, wherein the controller is configured to respectively obtain positions irradiated with the plurality of charged particle beams deflected by the controlled deflector, to generate control data based on the positions irradiated with the plurality of charged particle beams deflected by the deflector, and to individually control the plurality of blankers based on the control data so as to individually adjust the intensities of the plurality of charged particle beams irradiated on the object.

2. The apparatus according to claim 1, wherein the controller is configured to hold a coefficient used to obtain, with respect to each of the plurality of charged particle beams, error caused by the deflector in a position thereof on the object.

3. The apparatus according to claim 2, wherein the controller is configured to hold, as the coefficient, a coefficient representing a relationship between the error and a reference position of each of the plurality of charged particle beams.

4. The apparatus according to claim 3, wherein the controller is configured to hold, as the coefficient, a coefficient of a polynomial, with respect to a coordinate of the reference position, for representing the relationship.

5. The apparatus according to claim 2, wherein the controller is configured to hold the coefficient with respect to each component of a two-dimensional coordinate on the object.

6. The apparatus according to claim 2, wherein the coefficient is obtained via simulating of a strength and direction of an electric field generated by the deflector.

7. The apparatus according to claim 2, further comprising:
a detector configured to detect a charged particle beam,
wherein the controller is configured to obtain the coefficient via measuring of an irradiation position of a charged particle beam in each of a first deflection state and a second deflection state caused by the deflector based on an output from the detector with respect to each of the plurality of charged particle beams.

8. The apparatus according to claim 1, wherein the controller is configured to hold data corresponding to error in position of each of the plurality of charged particle beams, that is not deflected by the deflector, on the object, and to generate the control data further based on the data.

9. The apparatus according to claim 1, wherein the controller is configured, with respect to each of the plurality of charged particle beams, to obtain caused by the deflector in a position thereof on the object, and to generate the control data based on the error.

10. The apparatus according to claim 1, wherein the intensities of the plurality of charged particle beams irradiated on the object are individually adjusted by individually adjusting time during which the plurality of charged particle beams pass through the plurality of the blankers.

11. The apparatus according to claim 1, wherein the control data is generated by the controller so as to correct errors in irradiation positions of the plurality of charged particle beams deflected by the deflector with respect to target positions, to be deflected by the deflector, of the plurality of charged particle beams.

12. A method of manufacturing an article, the method comprising:
performing drawing a pattern on a substrate using a drawing apparatus;
developing the substrate on which the drawing has been performed; and
processing the developed substrate to manufacture the article,
wherein the drawing apparatus irradiates a plurality of charged particle beams on an object and thereby performs the drawing a pattern on the substrate with a plurality of charge particle beams, the apparatus including
a plurality of blankers configured to individually blank the plurality of charged particle beams to individually adjust intensities of the plurality of charged particle beams irradiated on the object;
a deflector configured to collectively deflect the plurality of charged particle beams to collectively change positions, irradiated with the plurality of charged particle beams, on the substrate; and
a controller configured to control the plurality of blankers and the deflector,
wherein the controller is configured to respectively obtain positions irradiated with the plurality of charged particle beams deflected by the controlled deflector to generate control data based on the positions irradiated with the plurality of charged particle beams deflected by the deflector, and to individually control the plurality of blankers based on the control data so as to individually adjust the intensities of the plurality of charged particle beams irradiated on the object.

13. The method according to claim 12, wherein the controller is configured, with respect to each of the plurality of charged particle beams, to obtain error caused by the deflector in a position thereof on the object, and to generate the control data based on the error.

* * * * *